United States Patent [19]

Traupe et al.

[11] Patent Number: 4,775,895
[45] Date of Patent: Oct. 4, 1988

[54] MODULAR IMAGE SENSOR STRUCTURE

[75] Inventors: Ulrich Traupe, Wiesbaden; Manfred Dennhoven, Osterspai; Bernd Heimann, Wiesbaden, all of Fed. Rep. of Germany

[73] Assignee: Heimann GmbH, Wiesbaden, Fed. Rep. of Germany

[21] Appl. No.: 924,973

[22] Filed: Oct. 30, 1986

[30] Foreign Application Priority Data

Dec. 13, 1985 [DE] Fed. Rep. of Germany ....... 3544182

[51] Int. Cl.$^4$ ............................................. H04N 1/024
[52] U.S. Cl. .................................... 358/294; 358/285; 358/293; 358/213.15
[58] Field of Search .............. 358/280, 294, 213, 293, 358/285, 213.11, 213.12, 213.15

[56]  References Cited

U.S. PATENT DOCUMENTS

| 4,356,513 | 10/1982 | Yoshimura et al. | 358/294 |
| 4,419,696 | 12/1983 | Hamano et al. | 358/213 |
| 4,438,457 | 3/1984 | Tanon et al. | 358/213 |
| 4,471,375 | 9/1984 | Oritsuki et al. | 358/294 |
| 4,644,411 | 2/1987 | Sato et al. | 358/294 |

Primary Examiner—Edward L. Coles, Sr.
Attorney, Agent, or Firm—Hill, Van Santen, Steadman & Simpson

[57] ABSTRACT

An image sensor module for reading optical information on an original and converting the information into electrical signals, has a row of opto-electrical sensors, each sensor having associated processing circuitry integrated therewith in the module. The drive module functions as the substrate for the sensors as well, which are separated from the substrate by an insulator layer, having openings therein for making electrical connection between the substrate and the sensor.

6 Claims, 4 Drawing Sheets

MODULAR IMAGE SENSOR STRUCTURE

BACKGROUND OF THE INVENTION

1. Field of the Invention

The present invention relates to an opto-electrical image sensor for reading information from an original and converting the information into electrical signals, and in particular to a modular structure for such a sensor.

2. Related Application

The present application is related to an application filed simultaneously herewith (Traupe and Dennhoven), U.S. Ser. No. 924,977.

DESCRIPTION OF THE PRIOR ART

Image sensor lines are known for reading optical information in the form of text or graphics, and converting the optical information into an analog electrical signal. The analog electrical signal is then converted into digital information for sorting and storing purposes. The digitally ordered and stored information can be made usable in a known manner for all types of image processing and image reproduction, for example, telecopying or video reproduction.

Heretofore, such imaging and conversion was achieved by line sensors having a feed perpendicular to the access of the line and constructed according to one of the following structures.

A first known structure uses demagnification optics for projecting an image of an original onto CCD lines having a length of, for example, 22.5 mm. A disadvantage of this method is the low depth of field of the imaging beam path and the extreme demands of precision adjustment which are required as a result. Moreover, the beam path occupies an undesirably large space.

Another known construction uses gradient index fiber optics for projecting a 1:1 image of an original onto an arrangement of CCD lines, each having a length of about 6 cm. This method has the disadvantages that the CCDs must be manufactured with a greatest possible length, and thus a greatest surface, in order to exploit the advantages of the CCD principle. As a consequence, however, high charge losses occur due to shifting the electrical charges in the CCDs over distances of 6 cm. Moreover, CCD chips having such a large area (for example, 65×5 mm$^2$=325 mm$^2$ cannot be currently manufactured with an adequately high yield at justifiable prices, particularly because the possibility of improving the yield by introducing redundancies does not exist.

A third known sensor structure also makes use of gradient index fiber optics for projecting a 1:1 image of the original onto sensor lines, however, these sensor lines consist of photoconductive material such as a-Si:H. Sensor lines employed in known embodiments of this structure consist of a linear arrangement of aSi:H photoconductor cells having eight, twelve or sixteen picture points/mm, each cell being provided with read-out and signal processing elements. The read-out and signal processing elements are manufactured using monocrystalline technique. Connections between the sensors and the read-out and signal processing elements are made by wires and conductor runs.

Two known principals are generally employed for driving the individual sensors and for signal processing. For read-out of the sensors, the so-called Vidicon principal is used, as explained in FIG. 1. A second principal measures the voltage at the light-sensitive cell, as described in connection with FIG. 2. In both principals, a plurality of individual sensors, such as sensors 2, 3 and 4, are individually serially driven by a shift register 1. Each sensor is schematically represented as a current source with a parallel capacitance.

In the read-out arrangement based on the Vidicon principal shown in FIG. 1, one electrode E is shared by all of the light-sensitive sensors 2, 3 and 4. Closure of respective switches 5, 6 and 7 after an integration time causes the corresponding sensor to be reset to its initial condition. The current which flows in the common electrode E is a measure of the amount of light absorbed by the corresponding sensor. By opening the respective switches 5, 6 and 7 by operation of the shift register 1, the integration phase for the respective sensor begins. As a result of the parallel connection of all sensors 2, 3 and 4 by the common electrode E, a large capacitance 8, 9 and 10 is present in parallel with the respective sensors 2, 3 and 4. A capacitive signal division thus occurs, which requires very high post-amplification. A poor signal-to-noise ratio is thus achieved.

Conditions are more favorable using the principal of measuring the voltage at the individual light-sensitive sensors 2, 3 and 4 (analog signal editing). As shown in FIG. 2, the shift register 1 operates to forward the discharge state of a sensor 2, 3 and 4 to the common signal output of respective amplifiers 11, 12 and 13 after the integration time, one amplifier being provided for each sensor. As soon as the amplifier for the next light sensitive sensor is connected to the output, the preceeding sensor is reset to its initial condition and a new integration phase for that sensor begins. During this time, the sensor voltage U(t) changes as follows:

$$U(t) = U_o - \frac{i \cdot t}{C}$$

wherein t is the integration time, i is the current in the sensor (proportional to the illumination intensity), C is the capacitance of the sensor plus the other components, such as connecting lines and the input capacitance of the amplifier (represented in bulk by capacitances 8, 9 and 10), and $U_o$ is the initial (start) voltage.

In addition to dependancy upon the illumination intensity and on the integration time, the size of the signal output is greatly dependent on the capacitance C. As can be seen from the above equation, the signal output becomes greater with lower capacitance, if the other values are otherwise unaltered. A goal in the design of a sensor line must therefore be minimization of the additional capacitances which are in parallel with the individual sensors. Such capacitances can be caused by conductor runs, contact surfaces, input capacitances, and the like.

SUMMARY OF THE INVENTION

It is an object of the present invention to provide a structure for a contact sensor line wherein such additional capacitances are minimized.

The above object is achieved in accordance with the principles of the present invention wherein the sensors are arranged in a drive module as an integrated circuit in combination with processing circuitry for each sensor. The drive module functions as a substrate for the sensors, with the sensors being disposed on the substrate separated by an insulation layer, with openings therein for electrical contact between the sensors and the substrate. A sensor line can then be constructed of a plurality of such modules disposed in succession. The additional capacitances are thereby reduced to a minimum as a result of the direct contact between the sensors and the drive module.

DESCRIPTION OF THE PREFERRED EMBODIMENTS

Figure 1:
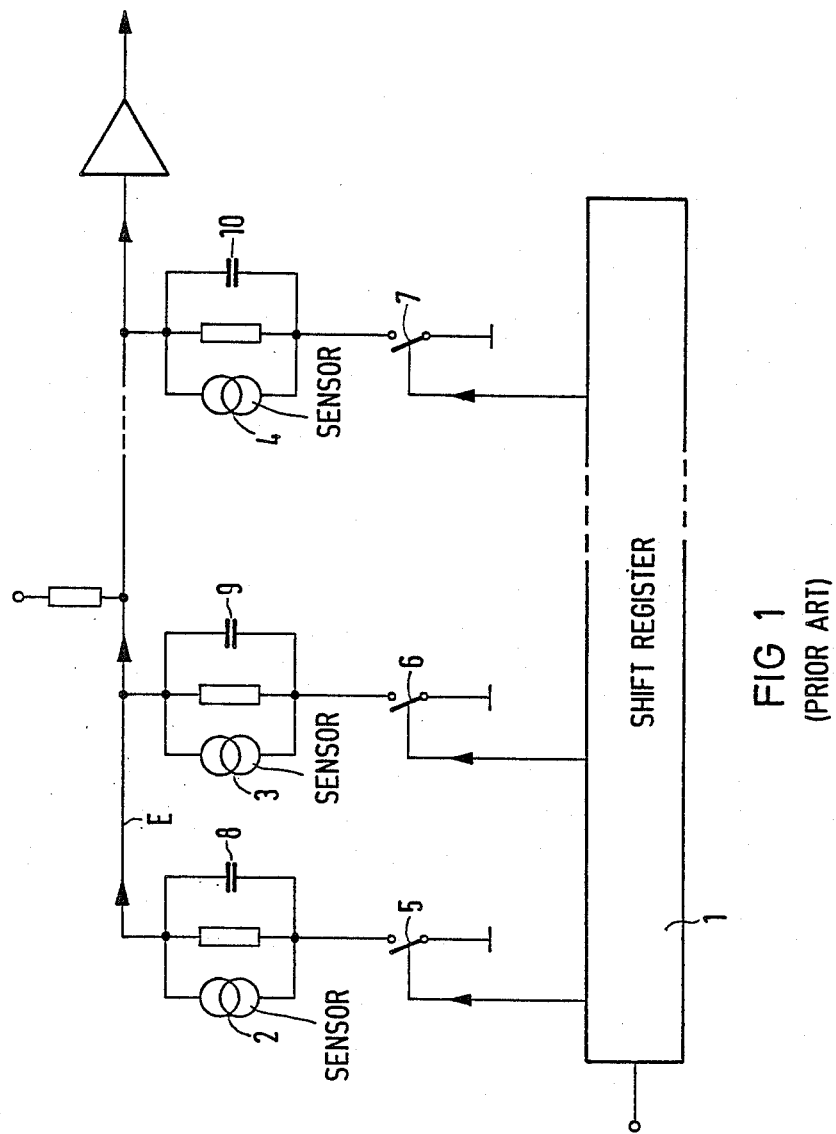
FIG. 1 is a schematic circuit diagram illustrating the known Vidicon principal of sensor read-out.
Figure 2:
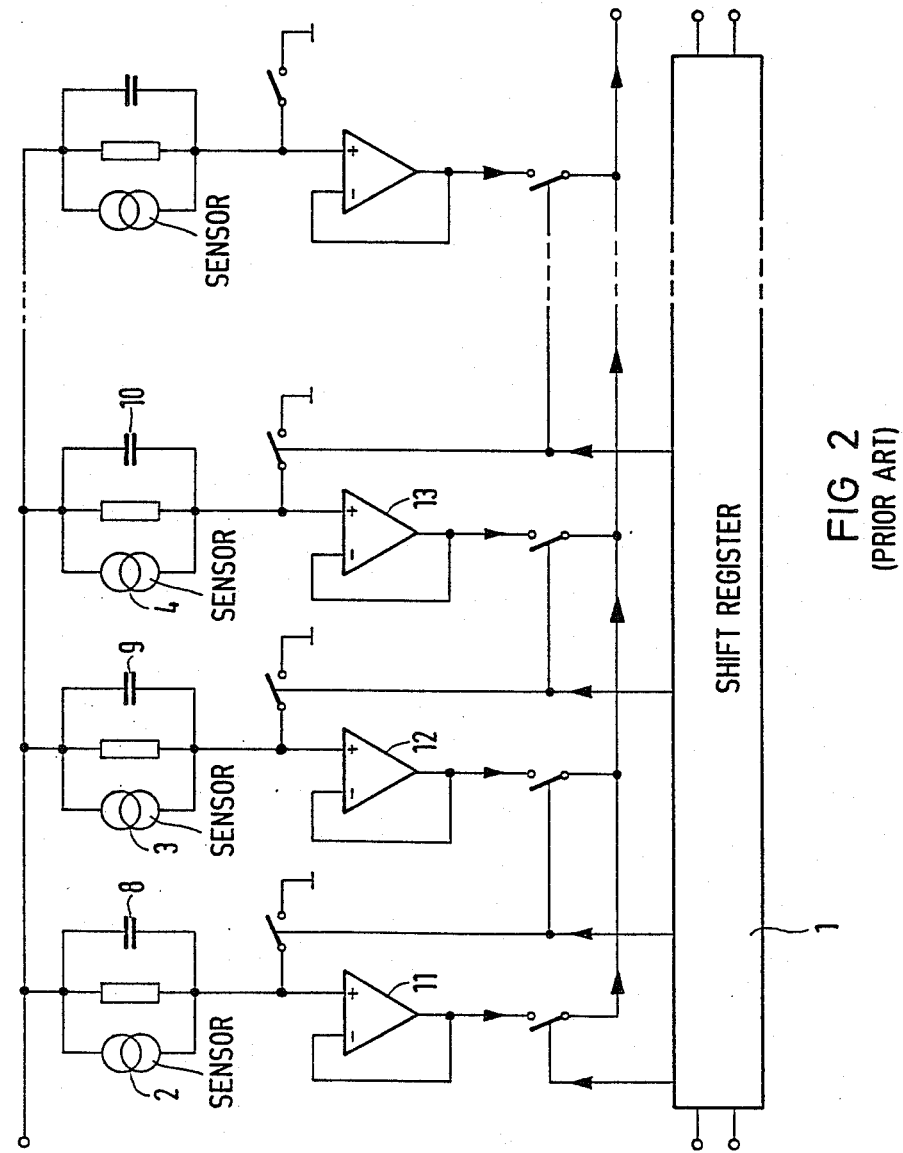
FIG. 2 is a schematic circuit diagram illustrating the known principal of sensor read-out by voltage measurement at the sensor.
Figure 3:
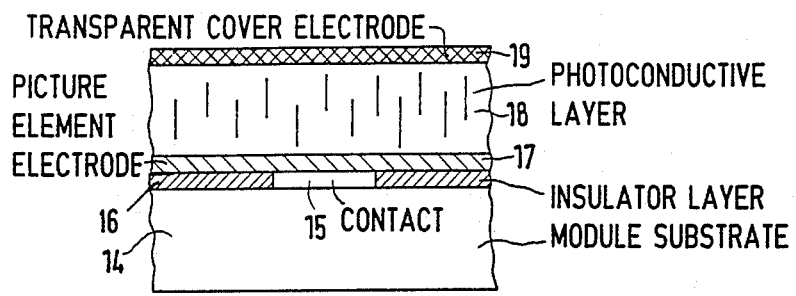
FIG. 3 is a side sectional view of a portion of a sensor module constructed in accordance with the principals of the present invention.
Figure 4:
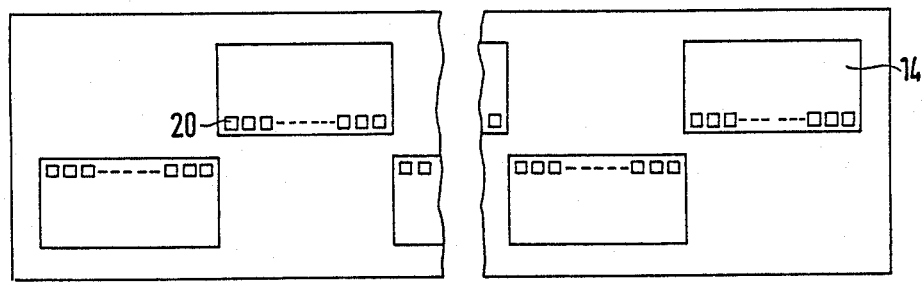
FIG. 4 is a plan view showing a plurality of sensor modules constructed in accordance with the principals of the present invention alternatingly disposed in succession.

A section taken through a picture element of a sensor line constructed in accordance with the principals of the present invention is shown in FIG. 3. As described in greater detail below, the sensor line is disposed on a drive module 14, which serves as a substrate for the picture element using integrated circuit technology. A contact 15 is provided on the substrate for each picture element. An insulator 16 is provided surrounding the contacts 15 for providing a smooth surface for the picture elements. The insulator layer 16 may consist, for example, of polyimide. A picture element electrode 17 is disposed on the insulator layer 16, in electrical connection via the contact 15 with the substrate 14. The picture element electrode 17 may consist, for example, of chrome, titanium or aluminum. A photoconductive layer 18 is applied over the electrode 17. The photoconductive layer 18 may consist, for example, of a-Si:H. A transparent cover electrode 19 consisting of, for example, ITO is disposed over the photoconductive layer 18. The arrangement of the picture elements 20 of the sensor line is shown in plan view in FIG. 4 with the drive modules 14. The drive modules 14 are disposed on a substrate of, for example, ceramic or glass. Two picture element lines having a spacing of, for example, 330 $\mu$m from each other are obtained. The drive modules 14 can be arranged such that either the first picture element of a module n+1 has the same spacing from the last picture element of a module n as from the second picture element in the module n+1, or such that one or more picture elements 20 of the successive drive modules 14 are exactly superimposed above each other. The drive modules 14 may each have, for example, 128 picture elements. An image sensor line having 12 picture elements/mm will thus have twenty drive modules 14 for a total of 2560 picture elements. Other numbers of picture elements per drive module 14 are possible, as are other picture element densities and other line lengths.

Figure 5:
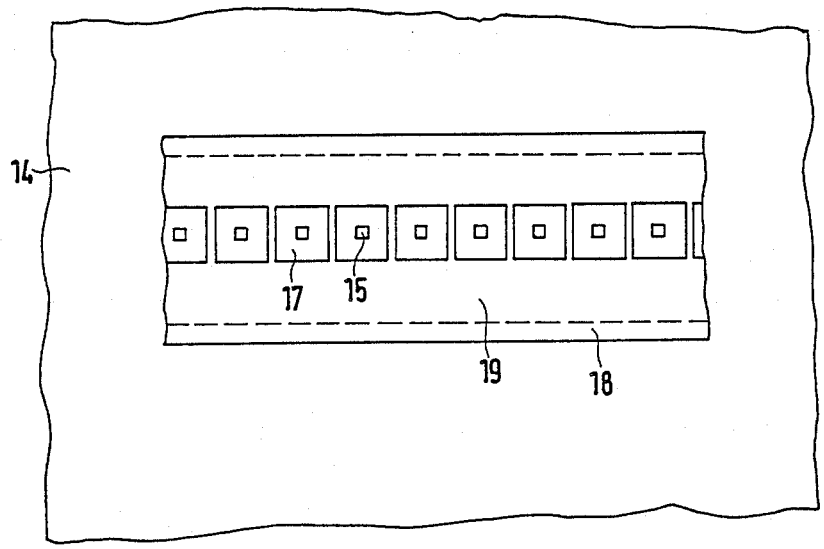
FIG. 5 is a plan view of a line of sensor elements on one of the modules constructed in accordance with the principals of the present invention.

A plan view of the picture elements on a drive module 14 is shown in FIG. 5. The insulating layer for providing the smooth surface has been omitted for clarity. The contacts 15 each have an edge length of, for example, 5 $\mu$m. The picture element electrode 17 have a grid dimension of, for example, 83 $\mu$m. The photoconductive layer 18 and the transparent cover electrode 19 are in the form of a homogenous strip. Dimensioning of the picture element areas in this embodiment is determined by the substantially square picture element electrodes 17. Other shapes and dimensions for the picture elements are, however, possible without departing from the scope of the inventive concept disclosed herein.

Figure 6:
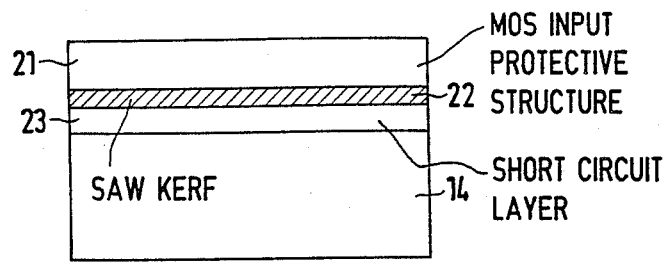
FIG. 6 is a plan view of a module constructed in accordance with the principals of the present invention with an input protection structure temporarily attached thereto.

As shown in the plan view of FIG. 6, the module 14 can be provided with an MOS input protective structure 21 for the picture element contacts. The protective structure 21 is present and functional during testing of the drive module 14, and is removed after the application of the photoconductive layer 18. A significant part of the capacitance at the input to the signal processing is eliminated in this manner. A saw joint or kerf 22 is shown in FIG. 6, as well as a short-circuit coating 23. The drive modules 14 are first connected on the wafer to MOS input protective structures 21 for the picture element contacts. After testing the drive modules 14 on the wafer, these protective structures 21 are bridged by the short-circuit coating 23. Subsequently, the drive modules 14 are sawn such that the protective structures 21 are separated from the drive module 14, however, the short-circuit coating 23 is preserved.

Figure 7:
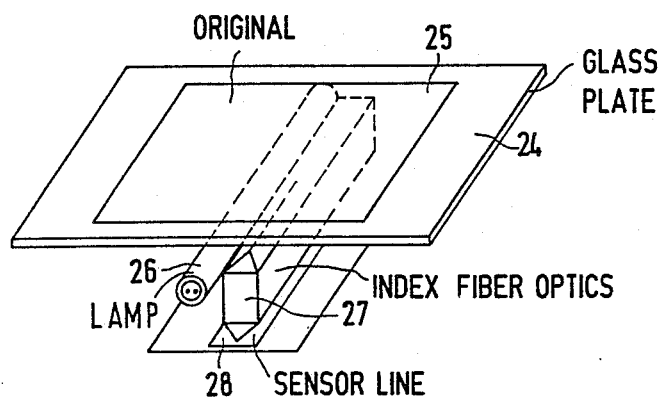
FIG. 7 is a perspective view of an apparatus for optically reading an original with a contact image sensor line constructed in accordance with the principals of the present invention.

After construction of the sensor line is completed, the short-circuit structure 23 of the picture elements is eliminated, for example, by laser or photo-etching techniques. The drive modules 14 are connected at their output with the remaining circuitry in an apparatus such as shown in FIG. 7. In the apparatus of FIG. 7, an original 25 to be scanned is disposed on a glass plate 24 and is illuminated by a lamp 26. The reflected light from the original 25 is conducted through index fiber optics 27 to a sensor line 28 constructed of a plurality of modules 14 as described above.

An alternative manufacturing method for the modules 14 is to manufacture the modules 14 without the MOS input protective structures 21. Coating of the drive modules 14 and the contacts 15 with the insulator layer 16, the picture element electrodes 17, the photoconductive layer 18 and the transparent cover electrode 19 is undertaken on the wafer. A complete function check of the picture elements on the modules 14 is undertaken before positioning the modules 14 in the line arrangement. This results in a considerable increase in yield, because only functional components will be used in constructing the sensor lines.

In the structure disclosed herein, the unavoidable capacitances of the interconnections, the contact surfaces and the MOS input protective structures are eliminated. By eliminating these added capacitance, the signal voltage increase at the high-impedance input to the signal processing circuitry is noticeably increased, and an increased signal-to-noise ratio is thus achieved in comparison to conventional structures given the same illumination and integration time. This permits transmission of an increased number of gray levels in a known manner.

Moreover, attachment and bonding of contact wires between the picture element electrodes and the drive modules, as is necessary in conventional structures, is eliminated. For example, given 2560 picture elements, 5120 bonding points would be required.

Because the sensor lines are manufactured on the drive modules 14, which are already positioned, all that is necessary is that the contacts 15 are electrically connected to the picture element electrodes 17 at an appropriate location, i.e., the contacts 15 must be positioned within the respective areas of the picture element electrodes 17. Given edge lengths of 5 $\mu$m for the contacts 15, and 93 $\mu$m for the picture element electrodes 17, a permissible positioning tolerance of the drive modules 14 amounting to $+35$ $\mu$m results. This is a significantly less stringent positioning demand than is required, for example, in the second conventional sensor construction described earlier employing a CCD line of 6 cm in length.

Figure 8:
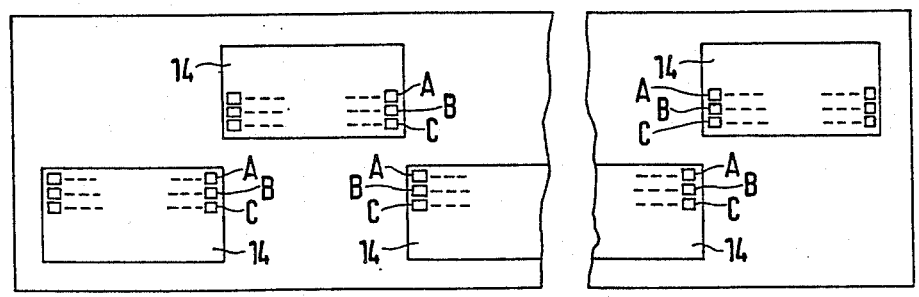
FIG. 8 is a plan view of a further embodiment of alternatingly disposed modules, each module having a plurality of module sensor lines thereon.

Instead of one picture element row per drive module 14, a plurality, such as three picture element rows A, B and C can be provided per drive module 14 as shown in FIG. 8. The spacing of the picture element rows A, B, C is based only on the conditions of the optical imaging system. By using line-by-line color imaging or filtering, the embodiment of FIG. 8 permits reading and processing of an original in color. The arrangement need not necessarily have three lines per drive module 14; other numbers of lines are also possible as are color codings other than line-shaped color codings. The important result is that, given the use of a plurality of lines, color processing with a higher picture element resolution is possible than using only a single sensor line, and no lengthening of the read-out time in comparison to black and white read-out times is necessary, due to the parallel evaluation of the color separations.

Without color coding, the embodiment of FIG. 8 can also be employed for accelerated black and white read out of an original, because the read-out time per page using this embodiment given the same integration time per line is shortened by a factor corresponding to the number of additional sensor lines. A discontinuous line advance, however, is necessary for this purpose.

Although modifications and changes may be suggested by those skilled in the art, it is the intention of the inventors to embody within the patent warranted hereon all changes and modifications as reasonably and properly come within the scope of their contribution to the art.

We claim as our invention:

1. A contact image sensor line comprising:
   a plurality of drive modules disposed in succession, each drive module having at least one module sensor line of opto-electrical sensors thereon having a structure consisting of a plurality of layers disposed on said drive module as a substrate, with an insulating layer being disposed between said drive module and said sensors with an electrical connection therethrough, said drive modules being disposed successively along said contact image sensor line with said module sensor lines in combination forming said contact image sensor line.

2. An image sensor line as claimed in claim 1, wherein said modules comprising said line are disposed offset relative to each other.

3. An image sensor line as claimed in claim 1, wherein each drive module further comprises an MOS input protective structure and means for temporarily attaching said MOS input protective structure to said drive module.

4. An image sensor line comprising:
   a plurality of drive modules disposed in succession, each drive module having at least one module sensor line thereon consisting of a plurality of picture elements integrated on said drive module using said drive module as a substrate, said drive module having an insulating layer thereon with a plurality of electrical contacts for the respective picture elements extending therethrough electrically connecting said picture elements to said substrate, and each picture element including in sequence a picture element electrode electrically connected to said contact, a photoconductive layer disposed above said picture element electrodes, and a transparent cover electrode over said photoconductive layer, said drive modules being disposed successively along said contact image sensor line with said module sensor lines in combination forming said contact image sensor line.

5. An image sensor line as claimed in claim 4, wherein said photoconductive layer consists of a-Si:H.

6. An image sensor line comprising:
   a plurality of drive modules disposed in succession, each drive module having a plurality of module sensor lines of opto-electrical sensors thereon having a structure consisting of a plurality of layers disposed on said drive module as a substrate, with an insulating layer being disposed between said drive module and said sensors with an electrical connection therethrough, said drive modules being disposed successively along said contact image sensor line with said module sensor lines in combination forming said contact image sensor line.

* * * * *